US008508018B2

(12) United States Patent
Akolkar et al.

(10) Patent No.: US 8,508,018 B2
(45) Date of Patent: Aug. 13, 2013

(54) BARRIER LAYERS

(75) Inventors: Rohan N. Akolkar, Hillsboro, OR (US);
Sridhar Balakrishnan, Rio Rancho, NM (US); James S. Clarke, Hillsboro, OR (US); Christopher J. Jezewski, Hillsboro, OR (US); Philip Yashar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/890,462

(22) Filed: Sep. 24, 2010

(65) Prior Publication Data

US 2012/0077053 A1   Mar. 29, 2012

(51) Int. Cl.
*H01L 29/00*   (2006.01)

(52) U.S. Cl.
USPC ............................ 257/508; 257/513; 257/520

(58) Field of Classification Search
USPC .......................................... 257/508, 520, 513
See application file for complete search history.

(56) References Cited

U.S. PATENT DOCUMENTS

| | | | | |
|---|---|---|---|---|
| 6,365,502 | B1 * | 4/2002 | Paranjpe et al. | 438/622 |
| 6,627,995 | B2 * | 9/2003 | Paranjpe et al. | 257/750 |
| 7,265,055 | B2 * | 9/2007 | Thompson et al. | 438/692 |
| 7,335,587 | B2 * | 2/2008 | Johnston et al. | 438/637 |
| 7,338,585 | B2 * | 3/2008 | Akolkar et al. | 205/118 |
| 7,341,946 | B2 * | 3/2008 | Kailasam et al. | 438/687 |
| 7,588,667 | B2 * | 9/2009 | Cerio, Jr. | 204/192.17 |
| 7,622,382 | B2 * | 11/2009 | Chowdhury et al. | 438/637 |
| 7,629,252 | B2 * | 12/2009 | O'Brien et al. | 438/641 |
| 7,670,948 | B2 * | 3/2010 | Lee | 438/639 |
| 7,786,006 | B2 * | 8/2010 | Suzuki | 438/637 |
| 7,867,891 | B2 | 1/2011 | O'Brien | |
| 7,867,897 | B2 * | 1/2011 | Gambino et al. | 438/652 |
| 7,956,465 | B2 * | 6/2011 | Huang | 257/751 |
| 7,972,972 | B2 * | 7/2011 | Lazovsky et al. | 438/765 |
| 8,138,084 | B2 * | 3/2012 | Akolkar | 438/653 |
| 2008/0113508 | A1 | 5/2008 | Akolkar | |
| 2009/0169760 | A1 | 7/2009 | Akolkar | |
| 2010/0078820 | A1 | 4/2010 | Kurokawa et al. | |
| 2010/0200991 | A1 | 8/2010 | Akolkar | |
| 2011/0147940 | A1 | 6/2011 | Akolkar | |

FOREIGN PATENT DOCUMENTS

| | | |
|---|---|---|
| KR | 10-2007-002775 A | 3/2007 |
| WO | 2012/040734 A2 | 3/2012 |
| WO | 2012/040734 A3 | 6/2012 |

OTHER PUBLICATIONS

International Search Report and Written Opinion Received for PCT Patent Application No. PCT/US2011/053322 mailed on Apr. 18, 2012, 9 pages.

* cited by examiner

*Primary Examiner* — Cathy Lam

(57) ABSTRACT

Methods for fabricating integrated circuit electrical interconnects and electrical interconnects are provided. Methods include providing a substrate having a surface, the surface having a feature formed therein wherein the feature is a trench or via, depositing a metal layer, the metal of the metal layer being selected from the group consisting of Ru, Co, Pt, Ir, Pd, Re, and Rh, onto surfaces of the feature, depositing a copper seed layer wherein the copper seed layer comprises a dopant and the dopant is selected from the group consisting of Mn, Mg, $MgB_2$, P, B, Al, Co and combinations thereof, onto the metal layer, and depositing copper into the feature. Devices comprising copper interconnects having metal liner layers are provided. Devices having liner layers comprising ruthenium are provided.

15 Claims, 3 Drawing Sheets

BARRIER LAYERS

BACKGROUND OF THE INVENTION

1. Field of the Invention

The embodiments of the present invention relate generally to semiconductor processing, integrated circuits, barrier layers for metal interconnects, low-k dielectrics, and gapfill during deposition in semiconductor processing applications.

2. Background Information

The push for ever-smaller integrated circuits (IC) places enormous performance demands on the materials used to construct IC devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 45 nm.

DETAILED DESCRIPTION OF THE INVENTION

Figure 1:
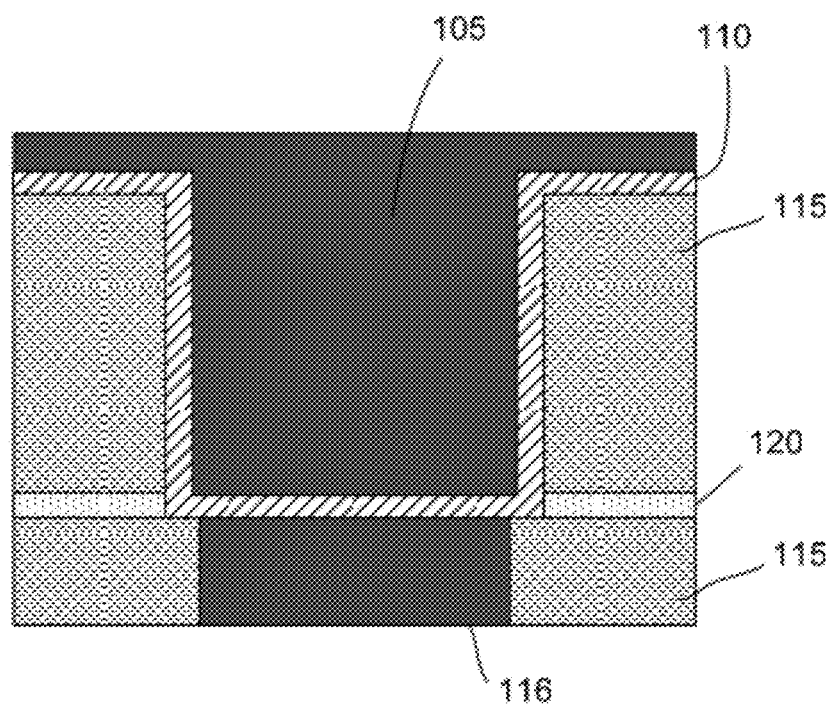
FIG. 1 shows an interconnect structure for an integrated circuit chip having barrier layer between the metal interconnect and the other materials (e.g., dielectric materials) that make up the integrated circuit chip.

Electronic connections between the electronic devices (e.g., transistors) in an integrated circuit (IC) chip are currently typically created using copper metal or alloys of copper metal. Devices in an IC chip can be placed not only across the surface of the IC chip but devices can also be stacked in a plurality of layers on the IC chip. Electrical interconnections between electronic devices that make up the IC chip are built using vias and trenches that are filled with conducting material. Layer(s) of insulating materials, frequently, low-k dielectric materials, separate the various components and devices in the IC chip.

The substrate on which the devices of the IC circuit chip are built is, for example, a silicon wafer or a silicon-on-insulator substrate. Silicon wafers are substrates that are typically used in the semiconductor processing industry, although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. IC devices that make up the chip are built on the substrate surface.

At least one dielectric layer is deposited on the substrate. Dielectric materials include, but are not limited to, silicon dioxide ($SiO_2$), low-k dielectrics, silicon nitrides, and or silicon oxynitrides. The dielectric layer optionally includes pores or other voids to further reduce its dielectric constant. Typically, low-k films are considered to be any film with a dielectric constant smaller than that of $SiO_2$ which has a dielectric constant of about 4.0. Low-k films having dielectric constants of about 3 to about 2.7 are typical of current semiconductor fabrication processes. The production of integrated circuit device structures often also includes placing a silicon dioxide ($SiO_2$) film or layer, or capping layer on the surface of low-k (low dielectric constant) ILD (inter-layer dielectric) films. Low-k films can be, for example, boron, phosphorous, or carbon doped silicon oxides. Carbon-doped silicon oxides can also be referred to as carbon-doped oxides (CDOs) and organo-silicate glasses (OSGs).

To form electrical interconnects, dielectric layers are patterned to create one or more trenches and or vias within which metal interconnects will be formed. The terms trenches and vias are used herein because these are the terms commonly associated with the features that are used to form metal interconnects. In general, a feature used to form a metal interconnect is a depression having any shape formed in a substrate or layer deposited on the substrate. The feature is filled with conducting interconnect material. The trenches and or vias may be patterned (created) using conventional wet or dry etch semiconductor processing techniques. Dielectric materials are used to isolate electrically metal interconnects from the surrounding components. Barrier layers are used between the metal interconnects and the dielectric materials to prevent metal (such as copper) migration into the surrounding materials. Device failure can occur, for example, in situations in which copper metal is in contact with dielectric materials because the copper metal can ionize and penetrate into the dielectric material. Barrier layers placed between a dielectric material, silicon, and or other materials and the copper interconnect can also serve to promote adhesion of the copper to the other material(s). Delamination (due to poor adherence between materials) is also a difficulty encountered in the fabrication of IC chips that leads to device failure.

Embodiments of the invention provide layers of materials that act as barriers between copper structures and other IC chip features. Advantageously, embodiments of the invention provide liners (barriers) that exhibit a lower resistivity than conventional barrier materials, such as tantalum (Ta), TaN, titanium (Ti), TiN, and WN. Embodiments of the invention do not require the use of conventional barrier layers, such as, for example, TaN, TiN, and WN. Additionally advantageously, embodiments of the invention enable the use of a thinner and or discontinuous copper seed layer during copper deposition into vias and or trenches which, as features are scaled increasingly smaller, enables complete gap fill in the vias and or trenches. Gapfill is especially a problem in high aspect ratio features.

FIG. 1 provides an electrical interconnect structure having a barrier layer. In FIG. 1, a metal via 105 (or trench) for an integrated circuit chip is separated from other components of the device by a barrier layer 110 that lines the bottom and sides of the via 105 (or trench). The metal via 105 is essentially a depression in the dielectric layer 115. The barrier layer 110 provides a barrier between dielectric layer 115 and the metal via 105 in this embodiment. The dielectric layer 115 can be, for example, what is frequently referred to as an interlayer dielectric layer (ILD). Additionally, in this embodiment, the device additionally features an etch stop layer 120 that resulted from the process used for device fabrication. An etch stop layer may be formed from a dielectric material, such as for example, silicon nitride, silicon oxynitride, and or silicon carbide. Optionally, the metal interconnect of FIG. 1, is in electrical communication with an additional metal interconnect structure 116. The metal used for interconnects is, for example, copper, aluminum (Al), gold (Au), silver (Ag) and or alloys thereof. In some embodiments of the invention, the metal used for interconnects is copper or an alloy of copper.

In FIG. 1, the barrier layer 110 is comprised of a thin ruthenium (Ru) layer that has been modified with a second material that has interacted with the Ru layer and or the surface of the dielectric material which is in contact with the Ru layer. The thin Ru layer typically comprises crystalline domains and does not create an adequate barrier to copper migration due to the grain boundaries. The transformation of the Ru layer and or the dielectric material in contact with the Ru layer by the second material creates a barrier layer 110 that blocks copper migration. The second material is, for example, manganese (Mn), magnesium (Mg), and or $MgB_2$. The ruthenium layer has an average thickness of between 1 nm and 4 nm. The second material is present in the barrier layer in an amount between 1 and 10 atomic weight percent of the ruthenium.

In additional embodiments, the self-forming barrier layer 110 is a thin metal layer of cobalt (Co), platinum (Pt), iridium (Ir), palladium (Pd), rhenium (Re), or rhodium (Rh), that has been modified with a second material. The second material has interacted with the first thin layer of material (Co, Pt, Ir, Pd, Re, or Rh) and or the surrounding dielectric to form a barrier to copper migration. The second material is Mn, Mg, boron (B), $MgB_2$, phosphorous (P), aluminum (Al), Co, or a combination thereof. The second material is capable of filling the metallic grain boundaries of the thin metal layer and or interacting with the ILD after migration through the thin metal layer to form a barrier, for example. A thermal annealing process can facilitate the mobility and or reactively of the second material. The thin metal layer has an average thickness of between 1 nm and 4 nm. The second material is present in the barrier layer in an amount between 1 and 10 atomic weight percent of the first material.

In embodiments of the invention, the second material (Mn, Mg, B, $MgB_2$, P, Al, Co, or a combination thereof) is not necessarily evenly distributed within the barrier layer. For example, boron may preferentially migrate through the metal of the barrier layer and accumulate on the surfaces of the sides of the trench or via (e.g., on the surface of the dielectric material).

In an embodiment of the invention, the barrier layer 110 is ruthenium in combination with a second material that is Mn. In further embodiments, the Mn that is part of the barrier layer is present in an amount between 1 and 5 at. % of the ruthenium. In additional embodiments of the invention, the barrier layer 110 is ruthenium and the second material is a combination of Mg and B. In further embodiments, the Mg and B that are part of the barrier layer are present in an amount between 1 and 5 at. % of the ruthenium.

Advantageously in embodiments of the invention, no tantalum (Ta) or TaN adhesion layer is used with the self-forming barrier layer. The omission of the Ta, TaN, Ti, TiN, or WN adhesion (liner) layer avoids the increase in resistance that is provided by the adhesion layer in the electrical interconnect structure. Additionally, as discussed herein, during formation of the interconnect structure, it is possible to use a copper seed layer that is not continuous with self-forming barrier layers. The relaxed requirements for the copper seed layer allow smaller features and features with higher aspect ratios to be formed using metal fill techniques such as electrodeposition (electroplating).

Figure 2A:
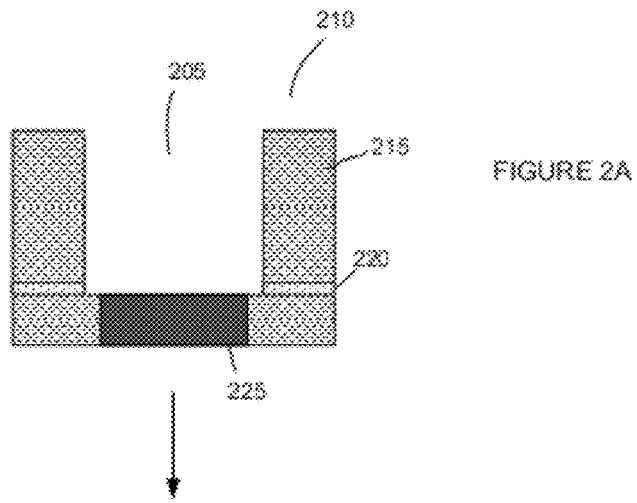
FIGS. 2A-D demonstrate a process for forming a barrier layer useful in forming metal interconnect structures for integrated circuit chips.
Figure 2B:
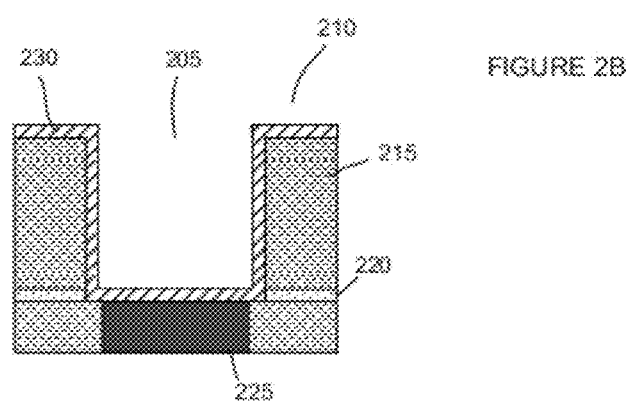
Figures 2C, 2D:
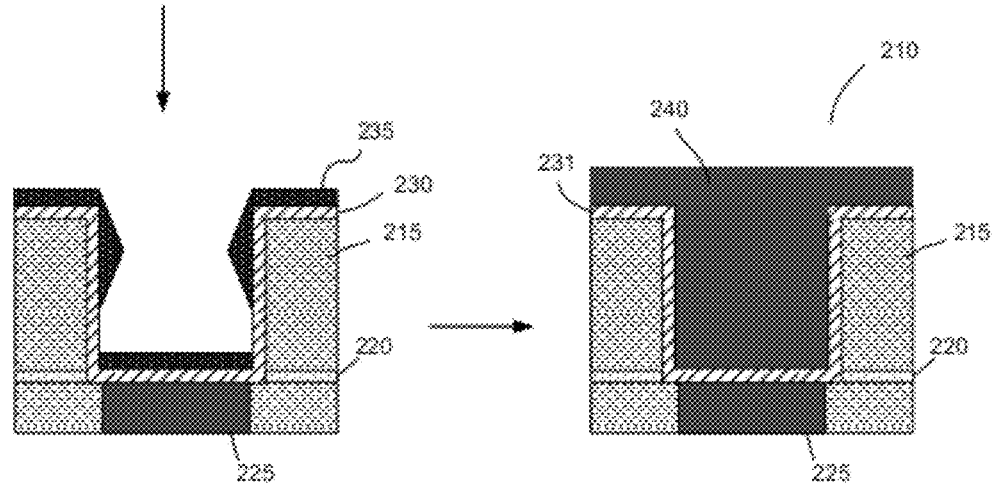

FIGS. 2A-D shows a process for creating a barrier layer for metallic interconnect structures. In FIG. 2A a gap structure 205 (e.g., a via or trench or depression) to be filled with a conducting material to create an electrical interconnect is provided in a substrate 210. The gap 205 is typical of the types of vias that are filled during back end metallization processes in which semiconductor devices (e.g., transistors) are interconnected in an integrated circuit chip. The gap structure is, for example, etched into an ILD layer 215 that is comprised of a dielectric material. The dielectric material is, for example, silicon dioxide, low-k dielectrics, and or other dielectric materials. Layer 220 in FIG. 2 is an etch stop layer created during device fabrication. Metallic structure 225 is an electrical device interconnect and is comprised of a conducting metal, such as, for example, copper metal and alloys of copper metal, tungsten metal or alloys of tungsten metal. A thin metallic layer 230 is deposited by atomic layer deposition (ALD), chemical vapor deposition (CVD), or physical vapor deposition (PVD), for example, and the structure of FIG. 2B is obtained. The thin metallic layer 230 is comprised of Ru, Co, Pt, Ir, Pd, Re, or Rh. In embodiments of the invention, the metallic layer 230 is ruthenium. A copper seed layer 235 containing copper and a dopant is deposited onto the structure and the structure of FIG. 2C is obtained. The dopant is for example, Mn, Mg, $MgB_2$, B, P, Al, Co, or a combination thereof. In embodiments of the invention the dopant is Mn or $MgB_2$. The dopant is present in the copper seed layer 235 in an amount of 1-20 atomic percentage (at. %) of the seed layer. The seed layer is deposited, for example, by PVD (plasma vapor deposition), CVD (chemical vapor deposition), or ALD. Optionally, the seed layer is a thin discontinuous layer. FIG. 2C shows a discontinuous copper seed layer 235. The copper seed layer 235 does not completely cover the metallic layer 230 in the embodiment of FIG. 2C. The copper interconnect 240 material (or other conducting material) is then electrodeposited and the structure is annealed providing the device of FIG. 2D. Annealing is accomplished, for example, by heating the structure to 350-400° C. for two hours. Other temperatures and annealing times are also possible. After annealing, the barrier layer 231 is impermeable to copper migration. The impermeability of the barrier layer 231 is engendered because of dopant migration from the copper seed layer 235 into and or through the metallic layer 230. The behavior of the dopant depends in part on the metal selected for the metal layer 230 and the dopant in the copper seed layer 235. In some cases, the dopant crosses the metallic layer 230 and interacts with the dielectric layer 215 to form a barrier layer 231. In other cases the dopant enters the metal layer 230 or a combination of both mechanisms occurs.

In the embodiment of FIGS. 2A-D, a discontinuous seed layer is shown. The seed layer can either be continuous or discontinuous.

Figure 3:
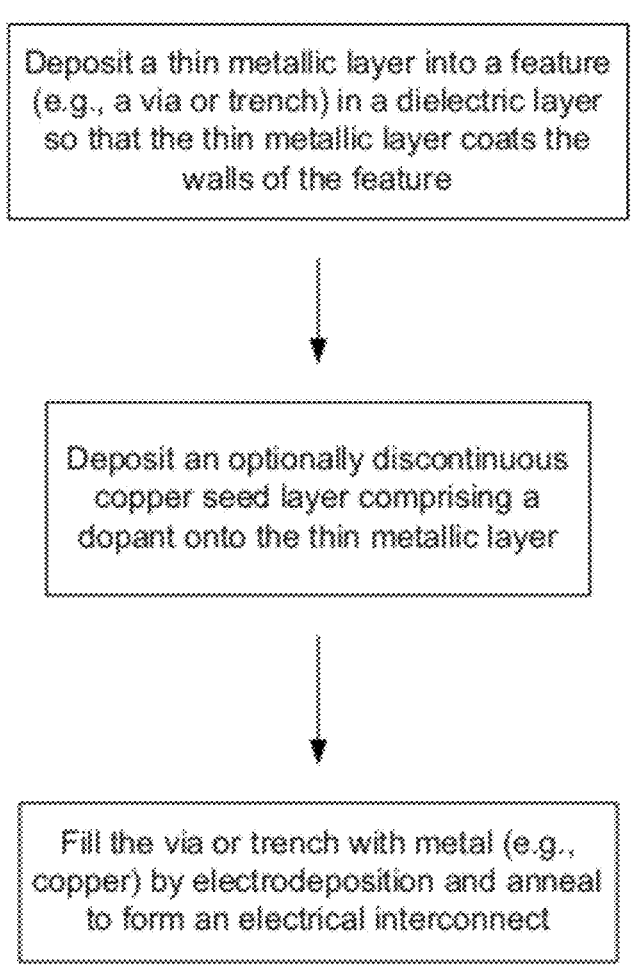
FIG. 3 describes a process for forming a barrier layer useful in metal interconnect structures for integrated circuit chips.

FIG. 3 describes a process for forming barrier layers for back end metallization, e.g., forming copper interconnects for transistor devices for integrated circuit chips. In FIG. 3, a trench or via that is to be filled with a conducting metal to form an electrically conducting interconnect is provided. The trench or via is a depression that is typically formed in a dielectric layer, such as an ILD layer through an etching process used in the semiconductor industry. The walls and bottom of the trench or via (the side(s) of the depression) are coated with a thin metallic layer comprised of Ru, Co, Pt, Ir, Pd, Re, or Rh. The thin metallic layer is deposited by ALD, CVD, or PVD, for example. The copper seed layer comprising a dopant is then deposited. The copper seed layer is deposited by ALD, PVD, or CVD, for example. Advantageously, the copper seed layer can be either continuous or discontinuous. The discontinuous copper seed layer allows a thinner seed layer to be deposited and potentially avoids pinching off features in situations in which small features are to be filled with metal. If a feature becomes pinched off, then an unwanted gap in the metal of the interconnect can form and can lead to device failure. In embodiments of the invention, the copper seed layer has an average thickness of 3 to 10 nm. The trench or via is then filled with metal through an electrodeposition process (electrochemical plating). Annealing the structure provides a electrical interconnect structure having a barrier layer that prevents the migration of metal interconnect material into surrounding materials.

In general, an electrodeposition process comprises the deposition of a metal onto a semiconductor substrate from an electrolytic solution that comprises ions of the metal to be deposited. A negative bias is placed on the substrate. The electrolyte solution can be referred to as a plating bath or an electroplating bath. The positive ions of the metal are attracted to the negatively biased substrate. The negatively biased substrate reduces the ions and the metal deposits onto the substrate.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and or structures may be included and or described features may be omitted in other embodiments.

We claim:

1. A device comprising;
a substrate having a layer of dielectric material on a surface of the substrate, the dielectric material having a feature formed therein, wherein the feature is a depression in the dielectric material, wherein the feature has at least one side wall and the side wall of the feature is coated with a barrier layer, wherein the barrier layer is comprised of a metal selected from the group consisting of Pt, Ir, Pd, Re, and Rh, and a substance selected from the group consisting of Mn, Mg, $MgB_2$, P, B, Al, and Co, wherein the substance is present in the barrier layer in an amount from 1 to 10 atomic weight percent of the metal that is selected from the group consisting of Pt, Ir, Pd, Re, and Rh, wherein the feature contains copper, and wherein the barrier layer is between the copper and the dielectric material, wherein the feature does not comprise a layer comprising Ti, Ta, or W between the copper and the dielectric material.

2. The device of claim 1 wherein the barrier layer is between 1 and 4 nm thick.

3. The device of claim 1 wherein the feature is a trench or via.

4. A device comprising;
a substrate having a layer of dielectric material on a surface of the substrate, the dielectric material having a feature formed therein, wherein the feature is a depression in the dielectric material, wherein the feature has at least one side wall and wherein the side wall of the feature is coated with a barrier layer, wherein the barrier layer is comprised of ruthenium and a substance selected from the group consisting of B, $MgB_2$, P, Al, and Co, wherein the substance is present in the barrier layer in an amount from 1 to 10 atomic weight percent of the ruthenium, wherein the feature contains copper, and wherein the barrier layer is between the copper and the dielectric material, wherein the feature does not comprise a layer comprising Ti, Ta, or W between the copper and the dielectric material.

5. The device of claim 4 wherein the barrier layer is between 1 and 4 nm thick.

6. The device of claim 4 wherein the feature is a trench or via.

7. A device comprising;
a substrate having a layer of dielectric material on a surface of the substrate, the dielectric material having a feature formed therein, wherein the feature is a depression in the dielectric material, wherein the feature has at least one side wall and wherein the side wall of the feature is coated with a barrier layer, wherein the barrier layer is comprised of ruthenium and a substance selected from the group consisting of $MgB_2$ and Al wherein the feature contains copper, and wherein the barrier layer is between the copper and the dielectric material, wherein the feature does not comprise a layer comprising Ti, Ta, or W between the copper and the dielectric material.

8. The device of claim 7 wherein the substance is present in the barrier layer in an amount from 1 to 10 atomic weight percent of the ruthenium.

9. The device of claim 7 wherein the substance is present in the barrier layer in an amount from 1 to 5 atomic weight percent of the ruthenium.

10. The device of claim 7 wherein the barrier layer is between 1 and 4 nm thick.

11. The device of claim 7 wherein the feature is a trench or via.

12. A device comprising;
a substrate having a layer of dielectric material on a surface of the substrate, the dielectric material having a feature formed therein, wherein the feature is a depression in the dielectric material, wherein the feature has at least one side wall and the side wall of the feature is coated with a barrier layer, wherein the barrier layer is comprised of a metal selected from the group consisting of Pt, Ir, Pd, Re, and Rh, and as substance selected from the group consisting of Mn, Mg, $MgB_2$, P, B, Co, and Al, wherein the feature contains copper, and wherein the barrier layer is between the copper and the dielectric material, wherein the feature does not comprise a layer comprising Ti, Ta, or W between the copper and the dielectric material.

13. The device of claim 12 wherein the substance is present in the barrier layer in an amount from 1 to 10 atomic weight percent of the metal that is selected from the group consisting of Pt, Ir, Pd, Re, and Rh.

14. The device of claim 12 wherein the barrier layer is between 1 and 4 nm thick.

15. The device of claim 12 wherein the feature is a trench or via.

* * * * *